(12) United States Patent
Nagasaka et al.

(10) Patent No.: US 7,116,528 B2
(45) Date of Patent: Oct. 3, 2006

(54) MAGNETORESISTIVE ELEMENT HAVING CURRENT-PERPENDICULAR-TO-THE-PLANE STRUCTURE AND HAVING IMPROVED MAGNETIC DOMAIN CONTROL

(75) Inventors: Keiichi Nagasaka, Kawasaki (JP); Yutaka Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 237 days.

(21) Appl. No.: 10/624,665

(22) Filed: Jul. 22, 2003

(65) Prior Publication Data
US 2004/0130834 A1    Jul. 8, 2004

(30) Foreign Application Priority Data
Jul. 24, 2002    (JP)    .............................. 2002-214900

(51) Int. Cl.
*G11B 5/39*    (2006.01)

(52) U.S. Cl. ............... 360/322; 360/324.12; 360/324.2

(58) Field of Classification Search ................. 360/322
See application file for complete search history.

(56) References Cited

U.S. PATENT DOCUMENTS

| | | | |
|---|---|---|---|
| 6,731,475 B1 * | 5/2004 | Ikeda | ......................... 360/322 |
| 6,754,052 B1 * | 6/2004 | Asida et al. | ................. 360/322 |
| 6,914,757 B1 * | 7/2005 | Yuasa et al. | ................. 360/322 |
| 2001/0005301 A1 | 6/2001 | Matahiro et al. | |
| 2002/0030946 A1 | 3/2002 | Koji | |
| 2002/0039265 A1 | 4/2002 | Hiromi et al. | |
| 2002/0097533 A1 | 7/2002 | Tomomi et al. | |
| 2002/0135948 A1 | 9/2002 | Tomomi et al. | |

FOREIGN PATENT DOCUMENTS

EP        0 801 380 A2    10/1997

* cited by examiner

*Primary Examiner*—A. J. Heinz
(74) *Attorney, Agent, or Firm*—Greer, Burns & Crain, Ltd.

(57) ABSTRACT

A smaller electrode layer of an upper electrode is formed on a surface of a free magnetic layer. A domain controlling film of an insulating material is formed adjacent to the smaller electrode layer on the surface of the free magnetic layer. Magnetization of the free magnetic layer is oriented in a single direction based on magnetic exchange coupling between the domain controlling film and the free magnetic layer. An electric connection is established between the free magnetic layer and the upper electrode only through the smaller electrode layer. The path of a sensing current can be reduced in the free and a pinned magnetic layer. A higher sensitivity can thus be obtained in the CPP structure magnetoresistive element. Effective magnetic core width can also be reduced in the CPP structure magnetoresistive element.

12 Claims, 5 Drawing Sheets

MAGNETORESISTIVE ELEMENT HAVING CURRENT-PERPENDICULAR-TO-THE-PLANE STRUCTURE AND HAVING IMPROVED MAGNETIC DOMAIN CONTROL

BACKGROUND OF THE INVENTION

1. Field of the Invention

The present invention relates to a current-perpendicular-to-the-plane ("CPP") structure magnetoresistive element which allows a sensing current to flow through a magnetoresistive film, which is layered over a predetermined datum plane, and along a perpendicular direction normal to the datum plane. More particularly, the present invention relates to a CPP structure magnetoresistive element which includes an electrically-conductive free magnetic layer, an electrically-conductive pinned magnetic layer, and an electrically-conductive non-magnetic intermediate layer interposed between the free and pinned magnetic layers.

2. Description of Related Art

A CPP structure magnetoresistive element including a so-called spin valve film is known in the art. A CPP structure magnetoresistive element of the known type allows magnetization of a free ferromagnetic layer within a spin valve film to rotate in response to an applied magnetic field. In such cases, it would be preferable to previously establish the magnetization along a predetermined single direction within the free ferromagnetic layer. A pair of so-called domain controlling films are thus utilized to orient the magnetization. These domain controlling films are disposed to interpose the spin valve film over the datum plane. The free ferromagnetic layer of the spin valve film is thus located within a biasing magnetic field established between the domain controlling films.

The intensity of the biasing magnetic field, however, becomes reduced at a location more remote from the domain controlling film within the free ferromagnetic layer. A magnetic field having such a smaller intensity tends to lead to a failure to establish a unity of the magnetization, or a single magnetic domain, within the free ferromagnetic layer. A biasing magnetic field of a sufficient intensity cannot therefore be obtained without further reducing the size or width of the spin valve film. Additionally, such domain controlling films suffer from less accuracy in form or shape in a production process. Since the intensity of the biasing magnetic field tends to be influenced by the form or shape of the domain controlling films, it has been difficult to obtain a stable biasing magnetic field according to the conventional method.

Spin valve films are generally made of electrically-conductive materials. Sensing currents are therefore able to flow through anywhere in the entire spin valve film. Accordingly, it has been impossible to reduce the path of the sensing current within the spin valve film unless the spin valve film is also reduced in size. A reduced path of the sensing current can lead to a higher sensitivity of the CPP structure magnetoresistive element. Also, a reduced sensing current path can lead to a reduced effective width of a magnetic core, which serves to improve the resolution when the CPP structure magnetoresistive element is used to read magnetic information.

Accordingly an object of the present invention is to provide a CPP structure magnetoresistive element which can sufficiently establish a single magnetic domain within a free magnetic layer without having to further reduce the size of a magnetoresistive film.

SUMMARY OF THE INVENTION

According to a first aspect of the present invention, there is provided a current-perpendicular-to-the-plane structure magnetoresistive element including an electrically-conductive free magnetic layer, an electrically-conductive pinned magnetic layer, an electrically-conductive non-magnetic intermediate layer interposed between the free and pinned magnetic layers, a primary electrode layer made of an electrically-conductive material, a smaller electrode layer made of an electrically-conductive material and interposed between the free magnetic layer and the primary electrode layer, and a domain controlling film made of an insulating magnetic material and disposed adjacent to the smaller electrode layer between the free magnetic layer and the primary electrode layer.

A second aspect of the present invention provides a current-perpendicular-to-the-plane structure magnetoresistive element including an electrically-conductive free magnetic layer, an electrically-conductive pinned magnetic layer, an electrically-conductive non-magnetic intermediate layer interposed between the free and pinned magnetic layers, a primary electrode layer made of an electrically-conductive material, a smaller electrode layer made of an electrically-conductive material and interposed between the free magnetic layer and the primary electrode layer, a domain-controlling film made of a magnetic material and disposed adjacent the smaller electrode layer, the domain controlling film contacting the free magnetic layer, and an insulating layer disposed between the domain controlling film and the primary electrode layer.

For both aspects, the CPP structure magnetoresistive element may allow establishment of a single domain or alignment of magnetization in a free magnetic layer based on a magnetic exchange coupling between the domain controlling film and the free magnetic layer. The magnetic exchange coupling serves to reliably establish magnetization of the single domain within the free magnetic layer, as compared with a magnetostatic biasing field generated between a pair of domain controlling hard magnetic films according to the conventional manner, without further needing to reduce the size or lateral width of a magnetoresistive film, including its individual layers.

Additionally, an electric connection may be preferably established between the free magnetic layer and the primary electrode layer through only the smaller electrode layer. The smaller electrode layer serves to reduce the path of a sensing electric current in the free and pinned magnetic layers. The quantity of electric current can be therefore increased over a unit sectional area. A higher sensitivity can thus be obtained in the CPP structure magnetoresistive element with the same quantity of total electric current. Effective magnetic core width can be also reduced in the CPP structure magnetoresistive element based on the path reduction of the sensing electric current. Resolution improvement is thus realized when the CPP structure magnetoresistive element reads magnetic binary data.

The domain controlling film may be disposed adjacent to a rear surface of the smaller electrode layer which faces the front surface of an air bearing surface of a head slider. The domain controlling film may also include a pair of first bodies disposed adjacent to an air bearing surface of a head slider so as to interpose the smaller electrode layer therebetween, and a second body disposed adjacent the rear surfaces of the smaller electrode layer and the first bodies which face the front surfaces to the air bearing surface. The smaller electrode layer can further be disposed along the air bearing surface of the head slider. An electric current can thus be forced to flow along the air bearing surface. Accordingly, a sensitivity of the CPP structure magnetoresistive element can be reliably improved. Moreover, the domain controlling film may contact the free magnetic layer over a larger contact area.

The CPP structure magnetoresistive element of the present invention may be even further mounted on a head slider incorporated within any types of magnetic recording medium drives including a magnetic disk drive such as a hard disk drive, for example, a magnetic tape drive, and the like.

DETAILED DESCRIPTION OF THE INVENTION

Figure 1:
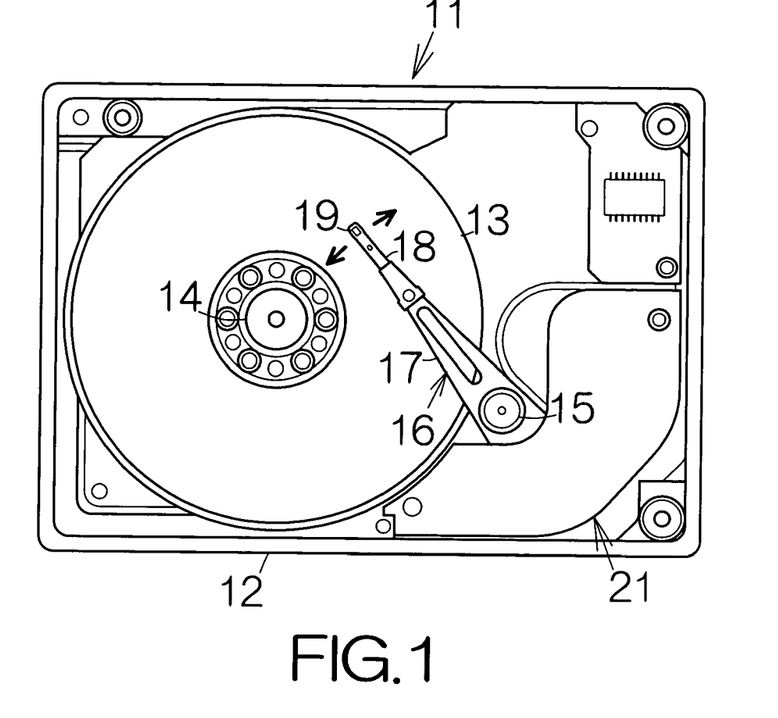
FIG. 1 is an elevated view of the inner structure of the hard disk drive.

FIG. 1 schematically illustrates the interior structure of a hard disk drive ("HDD") 11 as an example of a magnetic recording medium drive or storage device. The HDD 11 includes a box-shaped primary enclosure 12 defining an inner space of a flat parallelepiped, for example. At least one recording medium or magnetic recording disk 13 can be accommodated in the inner space within the primary enclosure 12. The magnetic recording disk 13 is mounted on a driving shaft of a spindle motor 14. The spindle motor 14 drives the magnetic recording disk 13 for rotation at a higher revolution rate, such as 7,200 rpm or 10,000 rpm, for example. A cover, not shown, is coupled to the primary enclosure 12 so as to define the closed inner space between the primary enclosure 12 and itself.

A carriage 16 is also accommodated in the inner space of the primary enclosure 12 for swinging movement about a vertical support shaft 15. The carriage 16 includes a rigid swinging arm 17 extending in the horizontal direction from the vertical support shaft 15, and an elastic head suspension 18 fixed to the tip end of the swinging arm 17, so as to extend forward from the swinging arm 17. A flying head slider 19 is cantilevered at the tip end of the head suspension 18 through a gimbal spring (not shown) according to a conventional structure. The head suspension 18 serves to urge the flying head slider 19 toward the surface of the magnetic recording disk 13. When the magnetic recording disk 13 rotates, the flying head slider 19 may receive an airflow generated along the rotating magnetic recording disk 13. The airflow serves to generate a lift on the flying head slider 19. The flying head slider 19 is thus allowed to keep flying above the surface of the magnetic recording disk 13 during rotation of the magnetic recording disk 13 at a higher stability, established by the balance between a lift and an urging force of the head suspension 18.

When the carriage 16 is driven to swing about the support shaft 15 during flight of the flying head slider 19, the flying head slider 19 may cross recording tracks defined on the magnetic recording disk 13 in a radial direction of the magnetic recording disk 13. This radial movement serves to position the flying head slider 19 right above a target recording track on the magnetic recording disk 13. An actuator 21, such as a voice coil motor ("VCM"), can thus be employed to realize a swinging movement of the carriage 16, for example. In the case where two or more magnetic recording disks 13 are incorporated within the inner space of the primary enclosure 12, a pair of the elastic head suspensions 18 may be disposed between the adjacent magnetic recording disks 13 according to a conventional method.

Figure 2:
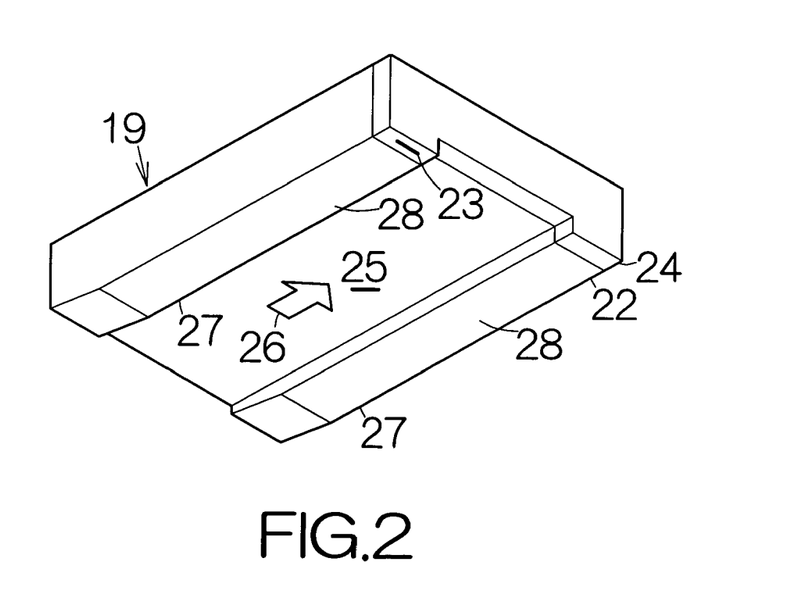
FIG. 2 is an enlarged perspective view of a flying head slider according to a one aspect of the present invention.

FIG. 2 illustrates one example of the flying head slider 19. The flying head slider 19 of this type includes a slider body 22 preferably made of $Al_2O_3$—TiC in the form of a flat parallelepiped, and a head protection layer 24 formed to spread over the trailing or outflow end of the slider body 22. The head protection layer 24 may be made of $Al_2O_3$. A read/write electromagnetic transducer 23 is embedded in the head protection layer 24. A medium-opposed surface or bottom surface 25 is defined continuously over the slider body 22 and the head protection layer 24 so as to face the surface of the magnetic recording disk 13 at a distance. The bottom surface 25 is designed to receive an airflow 26 generated along the surface of the rotating magnetic recording disk 13.

A pair of rails 27 are formed to extend over the bottom surface 25 from the leading or inflow end toward the trailing or outflow end. An individual rail 27 is structured to define an air bearing surface ("ABS") 28 at a top surface (not numbered). The airflow 26 generates the lift at the respective air bearing surfaces 28. The read/write electromagnetic transducer 23 embedded in the head protection layer 24 is exposed at the air bearing surface 28, as described in detail below.

According to a preferred embodiment of the present invention, a diamond-like-carbon ("DLC") protection layer may be formed over the air bearing surface 28 so as to cover over an exposed end of the read/write electromagnetic transducer 23. Additionally, the flying head slider 19 may take any shape or form other than that described above, without departing from the present invention.

Figure 3:
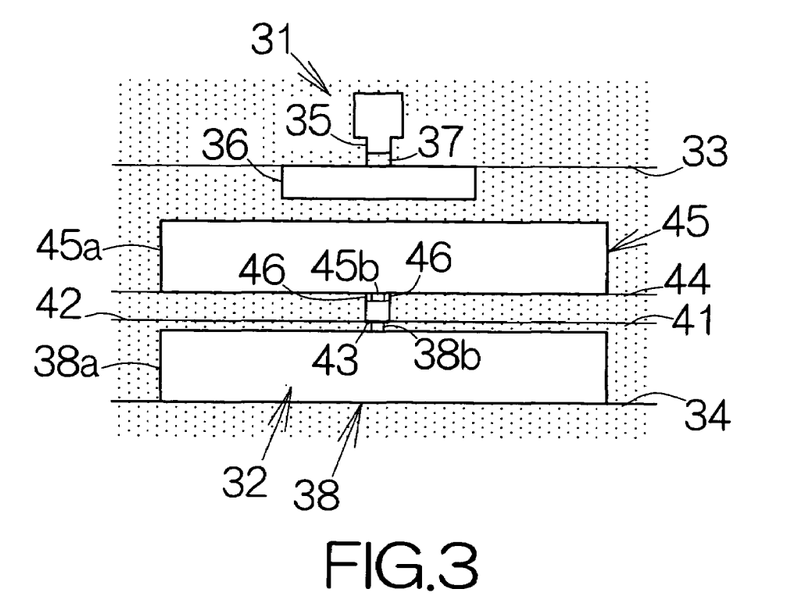
FIG. 3 is a front sectional view of a read/write electromagnetic transducer at an air bearing surface of the flying head slider.

FIG. 3 illustrates an enlarged detailed view of the read/write electromagnetic transducer 23 exposed at the air bearing surface 28. The read/write electromagnetic transducer 23 has an inductive write element or a thin film magnetic head 31, and a current perpendicular-to-the-plane (CPP) structure electromagnetic transducer element or CPP structure magnetoresistive (MR) read element 32. The thin film magnetic head 31 is configured to write magnetic bit data onto the magnetic recording disk 13 by utilizing a magnetic field induced in a conductive swirly coil pattern (not shown), for example. The CPP structure MR read element 32 may detect magnetic bit data by utilizing variation in the electric resistance in response to inversion of magnetic polarity in a magnetic field acting from the magnetic recording disk 13. The thin film magnetic head 31 and the CPP structure MR read element 32 are preferably interposed between an $Al_2O_3$ layer 33 as an upper half layer or overcoat film, and an $Al_2O_3$ layer 34 as a lower half layer or undercoat film. The overcoat and undercoat films, in combination, establish the head protection layer 24.

The thin film magnetic head 31 includes an upper magnetic pole layer 35 exposing the front end at the air bearing surface 28, and a lower magnetic pole layer 36 similarly exposing the front end at the air bearing surface 28. The upper and lower magnetic pole layers 35, 36 may be made of FeN, NiFe, or the like, for example. The combination of the upper and lower magnetic pole layers 35, 36 establish the magnetic core of the thin film magnetic head 31.

A non-magnetic gap layer 37 is interposed between the upper and lower magnetic pole layers 35, 36. The non-magnetic gap layer 37 may be preferably made of $Al_2O_3$, for example. When a magnetic field is induced at the conductive swirly coil pattern, a magnetic flux is exchanged between the upper and lower magnetic pole layers 35, 36. The non-magnetic gap layer 37 allows the exchanged magnetic flux to leak out of the air bearing surface 28. This leaked magnetic flux forms a magnetic field for recordation, namely, a write gap magnetic field.

The CPP structure MR read element 32 includes a lower electrode 38 spreading over the upper surface of the aluminum layer 34 as a basement insulation layer. The lower electrode 38 is preferably configured to comprise an electrically-conductive lead layer 38a and an electrically-conductive terminal piece 38b standing on the upper surface of the lead layer 38a. The lower electrode 38 may have not only a property of electric conductors, but also a soft magnetic property. If the lower electrode 38 is made of a soft magnetic electric conductor, such as NiFe, for example, the lower electrode 38 may preferably serve as a lower shield layer for the CPP structure MR read element 32. The lower electrode 38 may solely comprise the lead layer 38a without the terminal layer 38b.

The lower electrode 38 is embedded in an insulation layer 41 spreading over the surface of the aluminum layer 34. The insulation layer 41 is designed to extend over the surface of the lead layer 38a so as to contact a side surface of the terminal piece 38b. The combination of the terminal piece 38b and the insulation layer 41 thus represents a predetermined substructure layer. A flat surface 42 or datum plane can be defined continuously on the substructure layer over the top surface of the terminal piece 38b and the upper surface of the insulation layer 41.

An electromagnetic transducer film or spin valve film 43 is located on the flat surface 42 so as to extend along the air bearing surface 28. The spin valve film 43 extends over the flat surface 42 rearward from the front end exposed at the air bearing surface 28. The spin valve film 43 is structured to extend at least across the top surface of the terminal piece 38b. The terminal piece 38b may contact the bottom or lower boundary of the spin valve film 43 at least at the front end exposed at the air bearing surface 28. In such a configuration, an electric connection can be established between the spin valve film 43 and the lower electrode 38. The structure of the spin valve film 43 is described in detail below.

The flat surface 42 is covered with an overlaid insulation layer 44. An upper electrode 45 is disposed over the overlaid insulation layer 44. The upper electrode 45 may be designed to include a lead layer or primary electrode layer 45a extending over the surface of the overlaid insulation layer 44, and a smaller electrode layer 45b interposed between the top surface or upper boundary of the spin valve film 43 and the primary electrode layer 45a. The primary electrode layer 45a and the smaller electrode layer 45b are both preferably made of electrically-conductive materials. The smaller electrode layer 45b should contact the spin valve film 43 along the air bearing surface 28. In this manner, an electric connection can be established between the spin valve film 43 and the upper electrode 45.

The upper electrode 45 may be made of a soft magnetic electric conductor such as NiFe, for example. If the upper electrode 45 is configured to have not only a property of electric conductors, but also a soft magnetic property, the upper electrode 45 may also serve as an upper shield layer for the CPP structure MR read element 32. The space defined between the lower shield layer or the lower electrode 38 and the upper electrode 45 determines the linear resolution of the magnetic recordation or data along the recording tracks on the magnetic recording disk 13. The upper electrode 45 may be made of the same material as the lower magnetic pole layer 36. In this case, the upper electrode 45 may be integral to the lower magnetic pole layer 36 as a one piece configuration.

The CPP structure MR read element 32 includes a domain controlling film 46 interposed between the spin valve film 43 and the primary electrode layer 45a of the upper electrode 45. The domain controlling film 46 is disposed adjacent to the smaller electrode layer 45b. The domain controlling film 46 may be a hard magnetic film or an antiferromagnetic film., but either should include an insulating property. Such an insulating antiferromagnetic material may be represented by NiO, $Fe_2O_3$, or the like. The structure of the domain controlling film 46 is described in detail below.

Figure 4:
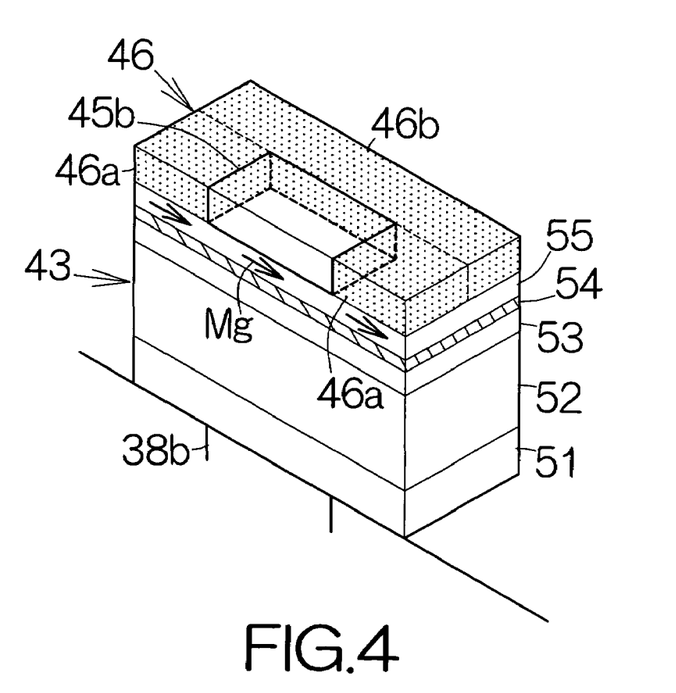
FIG. 4 is a perspective view of a CPP structure magnetoresistive read element according to one embodiment of the present invention.

As shown in FIG. 4, the spin valve film 43 includes an underlayer 51, a pinning layer such as an antiferromagnetic layer 52, a pinned magnetic layer 53, a non-magnetic intermediate layer 54 and a free magnetic layer 55, spreading over the flat surface 42, preferably in this respective sequence. The magnetization of the pinned magnetic layer 53 is fixed in a specific lateral direction, for instance, under the influence of the antiferromagnetic layer 52.

In this embodiment, the underlay 51 may be preferably made of an electric conductor such as Ta, for example. The antiferromagnetic layer 52 may be made of an antiferromagnetic material such as IrMn, (Pd)PtMn, or the like. The pinned magnetic layer 53 may be made of an electrically-conductive ferromagnetic material such as CoFe, for example. The non-magnetic intermediate layer 54 may be made of an electrically-conductive non-magnetic material such as Cu, for example. The free magnetic layer 55 may be made of an electrically-conductive material. The free magnetic layer 55 may be a multilayered film having soft magnetic property.

A pair of first bodies 46a and a second body 46b can be included in the domain controlling film 46. The first bodies 46a are designed to interpose the smaller electrode layer 45b of the upper electrode 45 along the air bearing surface 28 in the lateral direction. The second body 46b is disposed adjacent to rear surfaces of the smaller electrode layer 45b and the first bodies 46a. The surfaces exposed at the air bearing surface can thus be defined as "front" surfaces.

Specifically, the smaller electrode layer 45b and the first bodies 46a are interposed between the second body 46b and the air bearing surface 28. The domain controlling film 46 is received on the upper surface of the free magnetic layer 55 over the entire area of the first and second bodies 46a, 46b. In this manner, a magnetic exchange coupling can be established between the domain controlling film 46 and the free magnetic layer 55. The magnetic exchange coupling serves to orient the magnetization Mg of the free magnetic layer 55 in a single lateral direction. The entire free magnetic layer 55 thus behaves as a so-called single domain.

When the CPP structure MR read element 32 is opposed to the surface of the magnetic recording disk 13 for reading a magnetic information data, the magnetization Mg of the free magnetic layer 55 is allowed to rotate in the spin valve film 43 in response to the inversion of the magnetic polarity applied from the magnetic recording disk 13. The rotation of the magnetization Mg in the free magnetic layer 55 induces variation in the electric resistance of the spin valve film 43. When a sensing electric current is supplied to the spin valve film 43 through the upper and lower electrodes 45, 38, a variation in the level of any parameter such as voltage appears, in response to the variation in the magnetoresistance, in the sensing electric current output from the upper and lower electrodes 45, 38. The variation in the level can therefore be utilized to detect magnetic bit data recorded on the magnetic recording disk 13.

The smaller electrode layer 45b of the upper electrode 45 serves to reduce the path of the sensing electric current in the spin valve film 43. The terminal piece 38b of the lower electrode 38 also serves to reduce the path of the sensing electric current in the spin valve film 43. The quantity of the electric current can therefore be increased over a unit sectional area. A higher sensitivity can also be obtained with the same quantity of total electric current in the CPP structure MR read element 32. Moreover, the effective width of the magnetic core can be reduced in the CPP structure MR read element 32 based on the reduction in the path of the sensing electric current. According to this configuration, resolution may be improved when the CPP structure MR read element 32 reads the magnetic binary data.

The CPP structure MR read element 32 of the present invention allows the establishment of the single domain or alignment of the magnetization Mg in the free magnetic layer 55 based on the magnetic exchange coupling between the domain controlling film 46 and the free magnetic layer 55. The magnetic exchange coupling thus acts to reliably establish the magnetization of the single domain within the free magnetic layer 55 without a further reduction in the size or lateral width of the spin valve film 43, as compared with a magnetostatic biasing field generated between a pair of domain controlling hard magnetic films of the conventional manner.

A method of making the CPP structure MR read element 32 is now described. A wafer (not shown) is first prepared. A Ta layer, an antiferromagnetic layer, an electrically-conductive ferromagnetic layer, an electrically-conducive non-magnetic layer, an electrically-conductive ferromagnetic layer, and an insulating antiferromagnetic layer are layered in this respective sequence according to the conventional method. Sputtering may be utilized to form the layers. The Ta layer, the antiferromagnetic layer, the electrically-conductive ferromagnetic layer, the electrically-conductive non-magnetic layer, the electrically-conductive ferromagnetic layer, and the insulating antiferromagnetic layer are successively formed in a vacuum atmosphere, for example. The Ta layer, the antiferromagnetic layer, the electrically-conductive ferromagnetic layer, the electrically-conducive non-magnetic layer, the electrically-conductive ferromagnetic layer, and the insulating antiferromagnetic layer may be formed all over the surface of the wafer.

Figure 5:
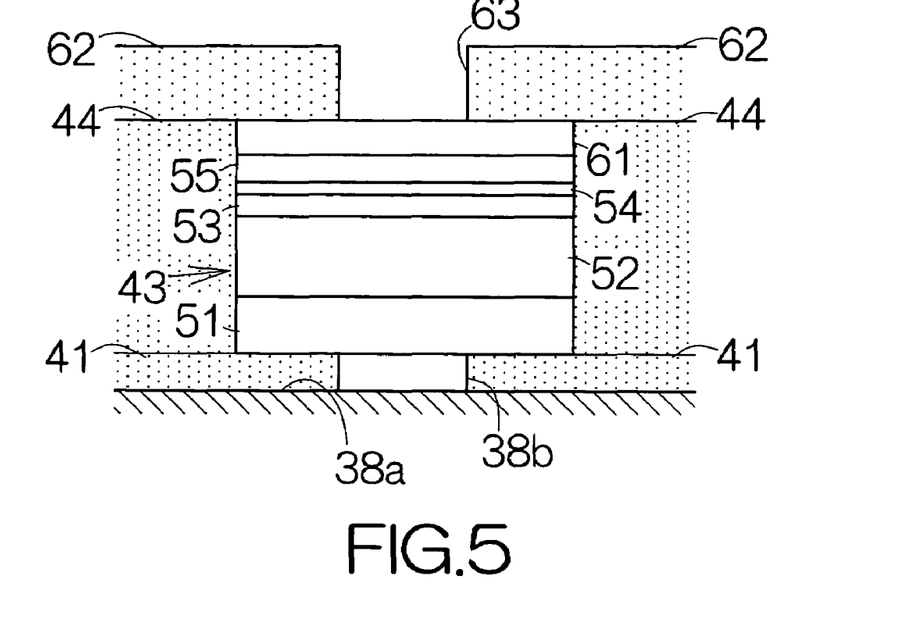
FIG. 5 is a partial sectional view of a wafer illustrating the process of forming a domain controlling film.

A photoresist film of a predetermined pattern is next formed on the surface of the insulating antiferromagnetic layer. The photoresist film is designed to have a contour of the spin valve film 43. When ion milling is effected, for example, the spin valve film 43 and insulating antiferromagnetic film of a predetermined form or shape remains under the photoresist film on the wafer. As shown in FIG. 5, the overlaid insulation layer 44 is then formed over the spin valve film 43 and the insulating antiferromagnetic layer 61.

Figure 6:
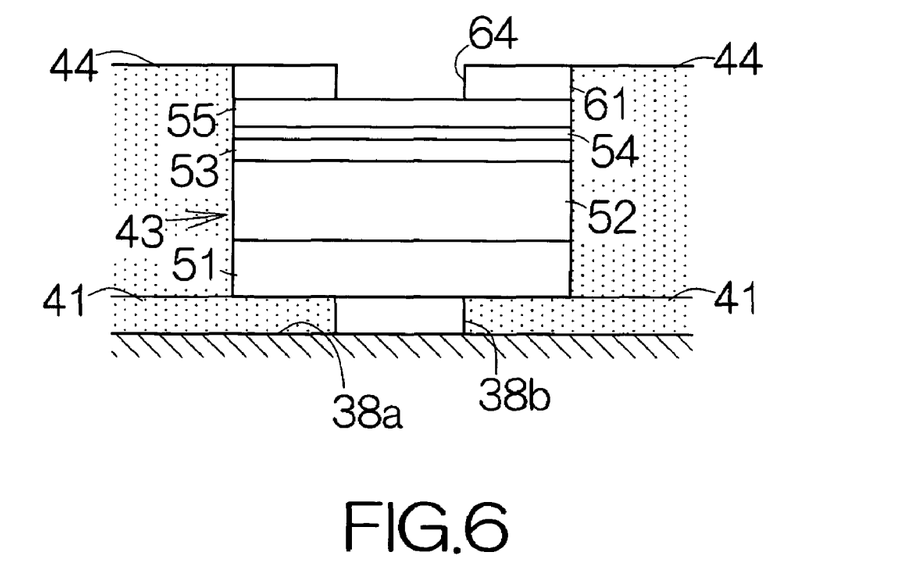
FIG. 6 is a partial sectional view of the wafer illustrating the process of forming the domain controlling film.

A photoresist film 62 is formed over the upper surface of the insulating antiferromagnetic layer 61 and the overlaid insulation layer 44. A void 63 corresponding to the shape of the smaller electrode layer 45b is defined in the photoresist film 62. The insulating antiferromagnetic layer 61 is partly exposed at the bottom of the void 63. When ion milling is effected, for example, the insulating antiferromagnetic layer 61 is removed out of the void 63. In this manner, a penetrating hole 64 can be defined in the insulating antiferromagnetic layer 61, as best seen in FIG. 6. The upper electrode 45 is then formed on the wafer. The upper electrode 45 is partly introduced into the penetrating hole 64. In this manner, the smaller electrode layer 45b of the upper electrode 45 can be obtained.

Figure 7:
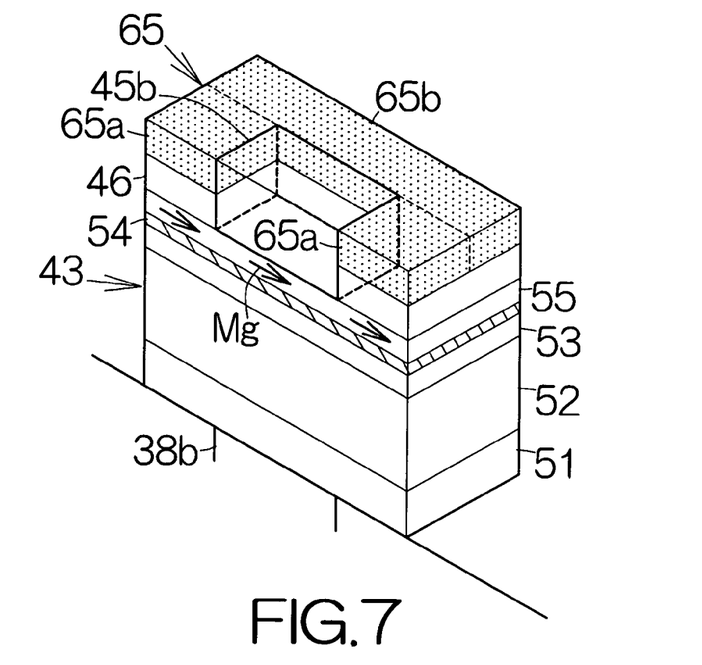
FIG. 7 is a perspective view of the CPP structure MR read element of FIG. 4, illustrating the structure of a domain controlling film according to one embodiment of the present invention.

An electrically-conductive magnetic material may be employed in place of the insulating magnetic material in the domain controlling film 46. In such a case, an insulating layer 65 is formed to spread over the upper surface of the domain controlling film 46, as best seen in FIG. 7. The insulating layer 65 may be either of a non-magnetic layer, or a magnetic layer such as a hard magnetic layer or an antiferromagnetic layer. A pair of first bodies 65a and a second body 65b may be configured in the insulating layer 65 in the same manner as the domain controlling film 46. Specifically, the first bodies 65a are designed to interpose the smaller electrode layer 45b of the upper electrode 45 along the air bearing surface 28 in the lateral direction. The second body 65b is disposed adjacent to the rear surfaces of the smaller electrode layer 45b and the first bodies 65a which face the front surfaces to the air bearing surface 28. A sensing electric current is thus allowed to flow through a reduced path established based on the smaller electrode layer 45b and the terminal piece 38b.

Figure 8:
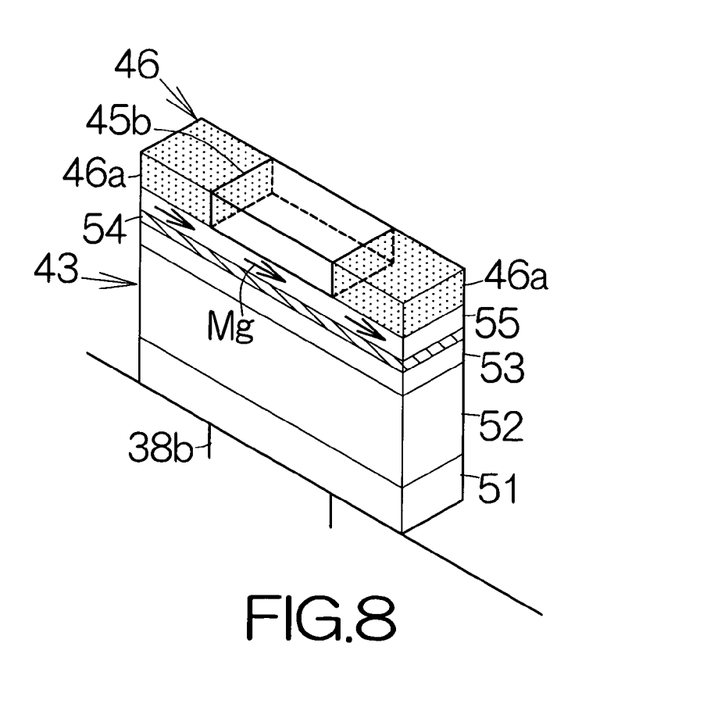
FIG. 8 is a perspective view of the CPP structure MR read element of FIG. 4, illustrating the structure of a domain controlling film according to another embodiment of the present invention.
Figure 9:
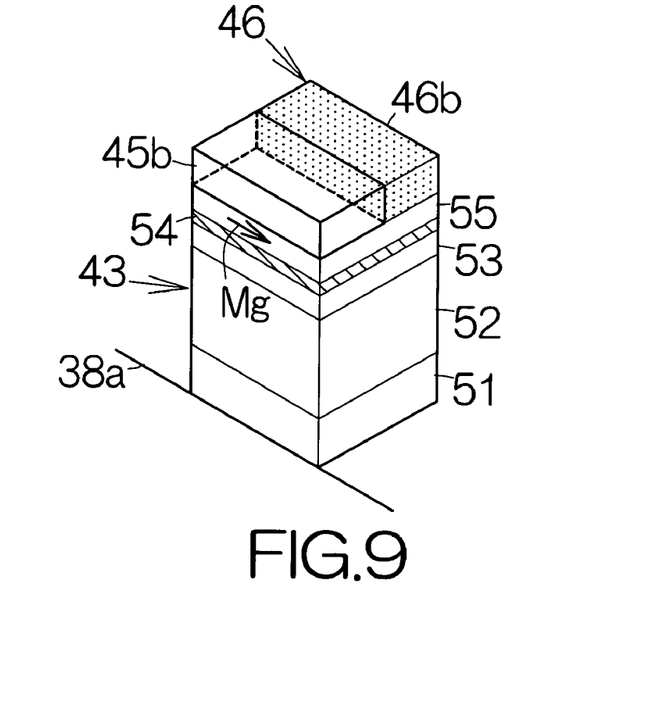
FIG. 9 is a perspective view of the CPP structure MR read element of FIG. 4, illustrating the structure of a domain controlling film according to a further embodiment of the present invention.

Now referring to FIG. 8, the domain controlling film 46 may have only the first bodies 46a interposing the smaller electrode layer 45b along the air bearing surface 28 on the free magnetic layer 55. As shown in FIG. 9, the domain controlling film 46 may have only the second body 46b contacting the rear surface of the smaller electrode layer 45b which faces the front end of the air bearing surface 28. According to either embodiment, a magnetic exchange coupling caused between the domain controlling film 46 and the free magnetic layer 55 reliably allows the establishment of the single domain or alignment of the magnetization Mg in the free magnetic layer 55. The magnetization of the single domain within the free magnetic layer 55 can thus be reliably obtained. Moreover, the path for a sensing electric current can be reduced in the spin valve film 43 in this manner. A higher sensitivity can also be obtained in the CPP structure MR read element 32. Even further, the effective width of the magnetic core can be reduced in the CPP structure MR read element 32 based on the reduction in the path of the sensing electric current.

Figure 10:
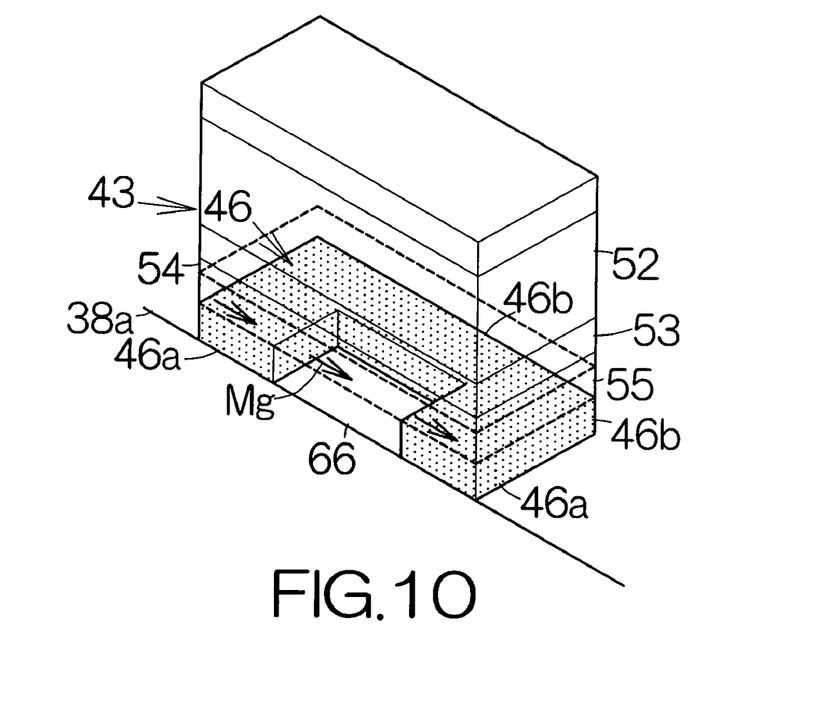
FIG. 10 is a perspective view of the CPP structure MR read element of FIG. 4, illustrating the structure of a spin valve film according to one embodiment of the present invention.

Alternatively, the spin valve film 43 may take the free magnetic layer 55 closer to the lower electrode 38 than the pinned magnetic layer 53 in the CPP structure MR read element 32. In such an embodiment, the domain controlling film 46, the free magnetic layer 55, the non-magnetic intermediate layer 54, the pinned magnetic layer 53 and the antiferromagnetic layer 52 are successively formed on the upper surface of the lead layer 38a of the lower electrode 38, as shown in FIG. 10, for example. A smaller electrode layer 66 is interposed between the lower electrode 38 and the free magnetic layer 55. An electric connection is thus established between the lower electrode 38 and the spin valve film 43 only through the smaller electrode layer 66. The magnetization Mg of the single domain within the free magnetic layer 55 can therefore be reliably obtained based on the magnetic exchange coupling between the domain controlling film 46 and the free magnetic layer 55. Moreover, the path for a sensing electric current can be reduced in the spin valve film 43 in the aforementioned manner.

According to the present invention, the free magnetic layer of the single domain can be reliably provided without a further reduction in the size of the magnetoresistive film including the free magnetic layer. One skilled in the art is aware that modifications or substitutions may be made the embodiments described above without appreciably departing from the invention.

What is claimed is:

1. A current-perpendicular-to-the-plane structure magnetoresistive element comprising:
   an electrically-conductive free magnetic layer;
   an electrically-conductive pinned magnetic layer;
   an electrically-conductive non-magnetic intermediate layer interposed between said free and pinned magnetic layers;
   a primary electrode layer made of an electrically-conductive material;
   a smaller electrode layer made of an electrically-conductive material and interposed between said free magnetic layer and said primary electrode layer; and
   a domain controlling film made of an insulating magnetic material and disposed adjacent to said smaller electrode layer, between said free magnetic layer and said primary electrode layer.

2. The current-perpendicular-to-the-plane structure magnetoresistive element according to claim 1, wherein said domain controlling film is disposed adjacent to a rear surface of said smaller electrode layer, a front surface of the smaller electrode layer facing an air bearing surface of a head slider.

3. The current-perpendicular-to-the-plane structure magnetoresistive element according to claim 1, wherein said domain controlling film further comprises:
   a pair of first bodies disposed adjacent to an air bearing surface of a head slider so as to interpose said smaller electrode layer therebetween; and
   a second body disposed adjacent to rear surfaces of said smaller electrode layer and said first bodies, front surfaces of the electrode layer and the first bodies facing said air bearing surface.

4. The current-perpendicular-to-the-plane structure magnetoresistive element according to any of claims 1–3, wherein said domain controlling layer is made of an antiferromagnetic layer.

5. A current-perpendicular-to-the-plane structure magnetoresistive element comprising:
   an electrically-conductive free magnetic layer;
   an electrically-conductive pinned magnetic layer;
   an electrically-conductive non-magnetic intermediate layer interposed between said free and pinned magnetic layers;
   a primary electrode layer made of an electrically-conductive material;
   a smaller electrode layer made of an electrically-conductive material and interposed between said free magnetic layer and said primary electrode layer;
   a domain controlling film made of a magnetic material and disposed adjacent to said smaller electrode layer, said domain controlling film contacting said free magnetic layer and said smaller electrode layer; and
   an insulating layer disposed between said domain controlling film and said primary electrode layer.

6. The current-perpendicular-to-the-plane structure magnetoresistive element according to claim 5, wherein said domain controlling film is disposed adjacent to a rear surface of said smaller electrode layer which faces a front surface of an air bearing surface of a head slider.

7. The current-perpendicular-to-the-plane structure magnetoresistive element according to claim 5, wherein said domain controlling film further comprises:
   a pair of first bodies disposed adjacent to an air bearing surface of a head slider so as to interpose said smaller electrode layer therebetween; and
   a second body disposed adjacent to a rear surface of said smaller electrode layer and said first bodies which face front surfaces of said air bearing surface.

8. A current-perpendicular-to-the-plane structure magnetoresistive element comprising:
   an electrically-conductive free magnetic layer;
   an electrically-conductive pinned magnetic layer;
   an electrically-conductive non-magnetic intermediate layer interposed between said free and pinned magnetic layers;
   a first electrode layer made of an electrically-conductive material;
   a second electrode layer made of an electrically-conductive material and interposed between said free magnetic layer and said first electrode layer; and
   a domain controlling film made of an insulating magnetic material and disposed adjacent to said second electrode layer, and between said free magnetic layer and said first electrode layer,
   wherein a surface of said second electrode layer contacts a surface of said first electrode layer and has a surface area smaller than a surface area of said first electrode layer.

9. The current-perpendicular-to-the-plane structure magnetoresistive element of claim 8, wherein said domain controlling film is disposed adjacent to only one side of said second electrode layer.

10. The current-perpendicular-to-the-plane structure magnetoresistive element of claim 8, wherein said domain controlling film is disposed adjacent to only two sides of said second electrode layer.

11. The current-perpendicular-to-the-plane structure magnetoresistive element of claim 8, wherein said domain controlling film is disposed adjacent to at least three sides of said second electrode layer.

12. The current-perpendicular-to-the-plane structure magnetoresistive element of claim 8, wherein said domain controlling film comprises at least two separate portions separated by said second electrode.

* * * * *